United States Patent
Arnaout et al.

(10) Patent No.: US 12,557,232 B2
(45) Date of Patent: Feb. 17, 2026

(54) COMPONENT ASSEMBLY FOR POWER ELECTRONICS AND METHOD FOR PROVIDING A COMPONENT ASSEMBLY FOR POWER ELECTRONICS

(71) Applicant: Volkswagen Aktiengesellschaft, Wolfsburg (DE)

(72) Inventors: Samy Arnaout, Niedenstein (DE); Jan Schmaeling, Baunatal (DE); Oliver Rang, Kassel (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 196 days.

(21) Appl. No.: 18/377,661

(22) Filed: Oct. 6, 2023

(65) Prior Publication Data
US 2024/0116468 A1     Apr. 11, 2024

(30) Foreign Application Priority Data
Oct. 7, 2022   (DE) .................... 10 2022 210 631.8

(51) Int. Cl.
*H05K 7/14*     (2006.01)
*B60R 16/03*    (2006.01)
*H02M 7/00*     (2006.01)

(52) U.S. Cl.
CPC ......... *H05K 7/14322* (2022.08); *B60R 16/03* (2013.01); *H02M 7/003* (2013.01)

(58) Field of Classification Search
None
See application file for complete search history.

(56) References Cited

U.S. PATENT DOCUMENTS

| | | | |
|---|---|---|---|
| 6,144,571 A * | 11/2000 | Sasaki | H01L 25/165 257/E25.031 |
| 6,958,532 B1 | 10/2005 | Nakayama | |
| 7,592,696 B2 * | 9/2009 | Hable | H01L 23/4334 257/713 |
| 7,977,804 B2 | 7/2011 | Christensen et al. | |
| 8,902,623 B2 | 12/2014 | Nishikimi et al. | |
| 9,756,754 B2 * | 9/2017 | Cheng | H05K 5/0247 |
| 9,887,183 B2 * | 2/2018 | Wang | H01L 23/49833 |
| 12,027,923 B2 * | 7/2024 | Chi | H05K 7/14322 |
| 2014/0198454 A1 | 7/2014 | Yuan et al. | |
| 2019/0353686 A1 | 11/2019 | Fushimi et al. | |

(Continued)

FOREIGN PATENT DOCUMENTS

| | | |
|---|---|---|
| CN | 202085082 U | 12/2011 |
| DE | 10129840 A1 | 1/2003 |
| DE | 102018220415 A1 | 5/2020 |

(Continued)

*Primary Examiner* — Courtney L Smith
(74) *Attorney, Agent, or Firm* — Muncy, Geissler, Olds & Lowe, P.C.

(57) ABSTRACT

A component assembly for power electronics, having at least one power module, at least one separate connection module, a separate control circuit carrier, and a housing. The at least one power module, the at least one connection module, and the separate control circuit carrier are arranged in a specified manner in the housing. The at least one power module is connected via first electrical signal lines to the at least one connection module and the at least one connection module is connected to the control circuit carrier via second electrical signal lines.

9 Claims, 2 Drawing Sheets

(56) References Cited

U.S. PATENT DOCUMENTS

2022/0149705 A1    5/2022  Chi et al.

FOREIGN PATENT DOCUMENTS

| | | |
|---|---|---|
| DE | 102019125105 A1 | 3/2021 |
| EP | 2023473 A2 | 2/2009 |
| EP | 3934087 A1 | 1/2022 |
| JP | 2009152310 A | 7/2009 |
| JP | 2012191766 A | 10/2012 |

* cited by examiner

COMPONENT ASSEMBLY FOR POWER ELECTRONICS AND METHOD FOR PROVIDING A COMPONENT ASSEMBLY FOR POWER ELECTRONICS

This nonprovisional application claims priority under 35 U.S.C. § 119(a) to German Patent Application No. 10 2022 210 631.8, which was filed in Germany on Oct. 7, 2022, and which is herein incorporated by reference.

BACKGROUND OF THE INVENTION

Field of the Invention

The invention relates to a component assembly for power electronics and a method for providing a component assembly for power electronics.

Description of the Background Art

Power modules are used in power electronics. Currently, these are electrically connected directly to a control circuit carrier (control board) with the help of press-fit pins, solder pins, plug contacts or screw contacts and, in particular, plugged onto it. In pulse inverters, power modules are usually connected via press-fit pins.

In a development phase of the power modules, interfaces between the power modules and the control circuit carrier must be defined at a very early stage, since the power modules usually have long tool creation and release times, which dominate the development time of pulse inverters. As a result, the power module already specifies an installation space layout and a design of the power electronics, especially the pulse inverter, at an early stage of development and restricts flexibility.

SUMMARY OF THE INVENTION

The object of the invention is to provide a solution to the above-mentioned problem, wherein the solution is intended in particular to achieve greater flexibility during the development phase of the power electronics.

In an example, a component assembly for power electronics is created, comprising at least one power module, at least one separate connection module, a separate control circuit carrier, and a housing, wherein the at least one power module, the at least one connection module and the control circuit carrier separate therefrom are arranged in the housing in a specified manner (i.e., in particular at specified spatial positions), wherein the at least one power module is connected to the at least one connection module by means of first electrical signal lines, and wherein the at least one connection module is connected to the control circuit carrier by means of second electrical signal lines.

Furthermore, a method for providing a component assembly for power electronics is provided, wherein at least one power module, at least one separate connection module, and a separate control circuit carrier are arranged in a predetermined manner and sequence in a housing and are electrically connected to each other, wherein the at least one power module is connected to the at least one connection module by means of first electrical signal lines and the at least one connection module is connected to the control circuit carrier by means of second electrical signal lines.

The component assembly and the method make it possible to decouple designs of electrical interfaces and/or connections of a power module and a control circuit carrier (which can also be referred to as a control board) from each other in the development process. For this purpose, a (mechanically) separate connection module from the power module and the control circuit carrier is created, via which the electrical connections are formed in each case. In particular, it is provided that electrical connections between the at least one power module and the control circuit carrier are formed exclusively via the at least one connection module. In particular, the at least one power module is not or will not be electrically connected directly to the control circuit carrier. The electrical connections are formed by means of the respective signal lines. The modules and the control circuit carrier are arranged in the housing in a predetermined manner. In particular, the specified method concerns a two-dimensional and/or three-dimensional position within the housing and/or a relative arrangement of the modules and/or the control circuit carrier to each other. In particular, the modules and the control circuit carrier are independent components, which are arranged in particular at different spatial positions.

An advantage of the component assembly and the method is that the development process, especially of the power module, can be made more flexible, since an interface can also be made at a later point in time by a less time-consuming adaptation of the connection module used. This saves time and effort and increases flexibility. Furthermore, an electrical connection between the power modules and the control circuit carrier can be designed to be more flexible with regard to interconnection and/or spatial arrangement. Transmitted by the at least one connection module, an electrical connection can also be formed over several planes, in particular, and/or the connection module can electrically connect two planes with each other.

In particular, the modules and the circuit carrier layer can be individual, i.e., components separate from each other. The modules and the circuit carrier layer are not (directly) in mechanical contact with each other, in particular.

In particular, a power module can be a power component of a power converter, especially a pulse inverter. In particular, the power module includes a half-bridge circuit, which is applied in particular to a ceramic substrate and is molded in particular. In particular, the component assembly may include several such power modules, in particular three such power modules. These multiple power modules can, for example, be or be arranged on a (common) heat sink.

In particular, a control circuit carrier can be a control board, in particular for a power converter, in particular a pulse inverter. The control circuit carrier includes, in particular, components for controlling and monitoring the at least one power module and/or the power converter, in particular the pulse inverter. For example, the control circuit carrier may include at least one of the following components: microcontroller, gate driver, ASIC, and/or a communication interface (e.g., CAN).

In particular, the connection module may include other active and/or passive electrical components in addition to (pure) electrical connections. In particular, it may be provided that electrical connections to several power modules and the control circuit carrier are formed via a single connection module with the signal lines. In particular, the connecting module has dimensions in the centimeter range, especially in the range of a few centimeters, for example, with a width in the range of 2 to 5 cm and a length in the range of 8 to 15 cm, for example, 3×9 cm² or 3×15 cm².

In the case of a gate path, the electrical signal lines can be designed in particular for a current in the range of up to 1 A, in particular up to 10 A, and further, in particular, up to 20

A. In the case of a source or drain path, the electrical signal lines are designed in particular for a current in the range of μA to mA.

In particular, a power module has dimensions in the centimeter range, especially in the range of a few centimeters, for example with side lengths of a width and length of between 3 cm and 15 cm each, for example 5×4 cm². Depending on the power requirement, however, the values can also be smaller or larger.

A connection area (which can also be referred to as a connection pad) where the electrical signal lines are connected to the modules or the control circuit carrier has in particular a side length in the range of 0.2 to 0.5 cm.

At least one connection module can have a predetermined electrical line layout which electrically connects connection areas of the first electrical signal lines in a predetermined manner (i.e., in particular according to a predetermined circuit diagram) with connection areas of the second electrical signal lines. As a result, a predefined assignment of the first electrical signal lines to the second electrical signal lines can be made. In particular, this assignment can be flexibly selected as part of the development process and/or adapted at a later date, which is advantageous for the development process. In particular, the electrical line layout may include electrical conductor tracks, for example in the form of stamped sheets.

At least a number of the connection areas at which the electrical signal lines are each connected to the modules and/or the control circuit carrier are at least partially surrounded by a molding compound. As a result, contact points where the electrical connections are formed can be better protected in order to reduce the risk of breakage and/or damage to the electrical connections. The molding compound is electrically non-conductive, in particular. The molding compound is or includes, for example, an epoxy resin.

It may also be provided that an area where the electrical signal lines are connected to the modules and/or the control circuit carrier, respectively, is completely surrounded by a molding compound across all signal lines. Furthermore, it may also be provided that an area of the surface of at least one connection module and/or of at least one power module and/or the control circuit carrier is completely covered with the molding compound. In particular, a surface of the connecting module may be completely covered with a molding compound.

Furthermore, it may be provided that the modules and/or the control circuit carrier are mechanically fixed via the molding compound, in particular to the housing.

At least one power module and/or the at least one connection module and/or the control circuit carrier with respect to one plane of the control circuit carrier can be arranged in different planes. On the one hand, this can save installation space, as the components can be arranged in different planes, especially at least partially on top of each other. On the other hand, it can also make an assembly and a manufacturing process more flexible. Thus, the electrical connections can be formed on different planes with reference to the respective connection areas at their respective ends. The connection module allows in particular for the bridging of different planes in an advantageous manner.

At least one power module, the at least one connection module, and the control circuit carrier can be mechanically connected to the housing. As a result, the components can be permanently connected to the housing. A mechanical connection to the chassis can also be a mechanical connection to a heat sink of the housing. In particular, the power module can be mechanically connected to a heat sink of the housing.

The at least one power module, the at least one connection module and the control circuit carrier can each be mechanically connected separately to the housing. As a result, the individual mechanical connections to the housing can be selected in each case adapted to the respective component. This can further increase flexibility in the development process.

The at least one power module can be at least partially disposed between the control circuit carrier and the housing, wherein the at least one connection module, with respect to a direction of expansion of a plane of the control circuit carrier, is located next to the control circuit carrier. In particular, this can save installation space. In addition, the assembly in the housing can be made more flexible, since it is possible to choose from a larger number of assembly options. In the method for providing the component assembly, it is then provided in particular that the at least one power module and the at least one connection module are arranged first, and then (at least partially above it) the control circuit carrier. First, the first electrical signal lines are formed between the at least one power module and the at least one connection module, especially if these components are already arranged in the housing. After the control circuit carrier has been arranged in the housing, the second electrical signal lines are then formed between the at least one connection module and the control circuit carrier.

At least a number of the first electrical signal lines and/or the second electrical signal lines can be formed as bond connections. In particular, the bond connections are designed as thick wire bond connections (wire thickness in the range of 125 μm). In particular, the bond connections may be designed as double stitch bond connections, thick wire bond connections, aluminum copper bond connections, aluminum bond connections and/or aluminum gold bond connections.

At least a number of the first electrical signal lines and/or the second electrical signal lines can be formed in the form of electrically conductive sheets. In particular, the sheets can be stamped. In particular, the sheets can be mechanically reinforced by additional elements, such as electrically non-conductive support elements. In this way, finger-like connections can be formed in particular, which form the electrical signal lines.

A vehicle is also provided, comprising at least one component assembly according to any one of the examples herein. In particular, a vehicle is a motor vehicle. In principle, however, the vehicle can also be another land, rail, water, air or space vehicle, for example an air taxi or a drone.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
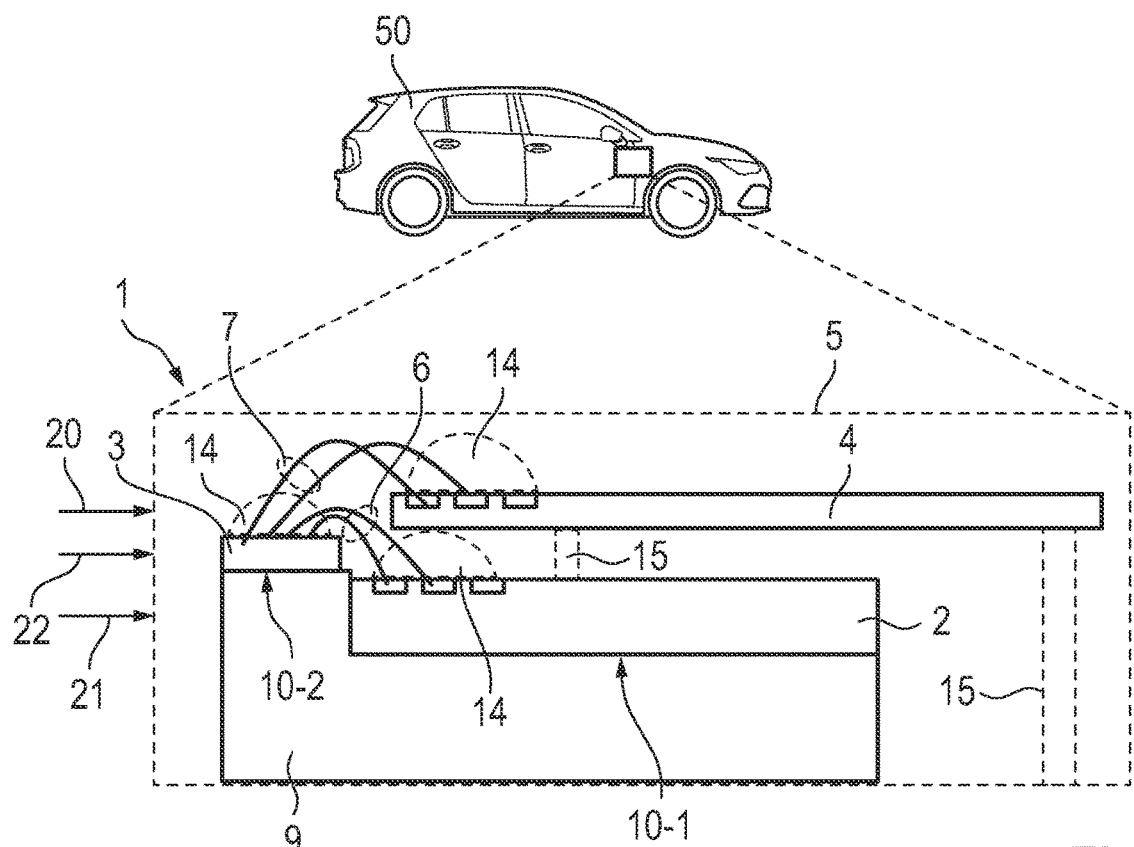
FIG. 1 shows a schematic diagram of examples of the component assembly for power electronics in a side view.

FIG. 1 shows a schematic representation of an example of the component assembly 1 for power electronics as a side view. For example, the component assembly 1 is arranged in a vehicle 50, in particular a motor vehicle. For example, the component assembly 1 is part of the power electronics of a pulse inverter.

The component assembly 1 comprises a power module 2, a separate connection module 3, a separate control circuit carrier 4 and a housing 5. In principle, further power modules 2 and connection modules 3 can be provided. The housing 5 is shown as a closed housing. In principle, however, the housing 5 can also have an opening on at least one side. The power module 2, the separate connection module 3 and the separate control circuit carrier 4 are arranged in the housing 5 in a specified manner (i.e., in particular at specified spatial positions). The power module 2 is connected to the connection module 3 by means of the first electrical signal lines 6. The connection module 3 is further connected to the control circuit carrier 4 by means of second electrical signal lines 7. The electrical signal lines 6, 7 are designed in particular as bond connections, in particular as thick wire bond connections.

The power module 2 and the connection module 3 can be arranged on a (in particular tier-shaped) heat sink 9 of the housing 5. In particular, it is provided that the heat sink 9 has tiers 10-1, 10-2, wherein the power module 2 is arranged on a lower tier 10-1 and the connection module 10-2 on an upper tier 10-2. If further modules are available, further tiers may be provided.

Figure 2:
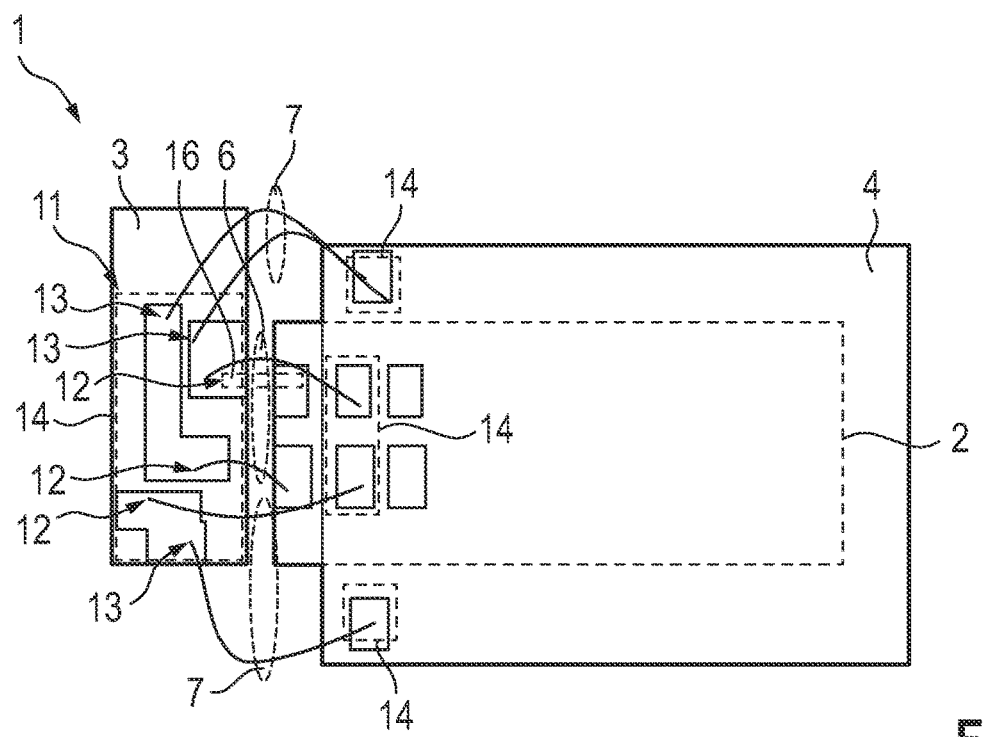
FIG. 2 shows a schematic representation of examples of the component assembly for power electronics in a top view.

It may be provided that at least one connection module 3 has a predetermined electrical line layout 11 (FIG. 2), which electrically connects connection areas 12 of the first electrical signal lines 6 in a specified manner with connection areas 13 of the second electrical signal lines 7. This example is schematically illustrated in FIG. 2. Electrical connections of the line layout 11 are designed in particular as conductor tracks and the connection areas 12, 13 are designed in particular as bond pads.

It may be provided that at least a number of the connection areas 12, 13 at which the electrical signal lines 6, 7 are connected respectively to the modules 2, 3 and/or the control circuit carrier 4 are at least partially surrounded by a molding compound 14. For example, the molding compound 14 may be or include an epoxy resin.

The power module 2 and/or the connection module 3 and/or the control circuit carrier 4 can be arranged in different planes 21, 22 with respect to a plane 20 of the control circuit carrier 4 (FIG. 1).

It may be provided that the power module 2, the connection module 3 and the control circuit carrier 4 are mechanically connected to the housing 5. In the case of the power module 2 and the connection module 3, this is done in particular via the heat sink 9, as described above. The control circuit carrier 4 may, for example, be arranged on the housing 5 by means of cylindrical threaded screws 15 and may be held by them in particular at a distance from the housing 5.

The power module 2, the connection module 3 and the control circuit carrier 4 can each be mechanically connected separately to the housing 5.

The power module 2 can be at least partially disposed between the control circuit carrier 4 and the housing 5, wherein the connection module 3 is located next to the control circuit carrier 4 with respect to a direction of expansion of a plane 20 of the control circuit carrier 4. This can be clearly seen in FIG. 2, where the connection module 3 is arranged at some distance from the control circuit carrier 4.

At least a number of the first electrical signal lines 6 and/or the second electrical signal lines 7 can be designed as bond connections. In principle, however, other types of connection can also be used, for example press fit pins.

At least a number of the first electrical signal lines 6 and/or the second electrical signal lines 7 can be formed as electrically conductive sheets 16 (shown as an example in FIG. 2).

Figure 3:
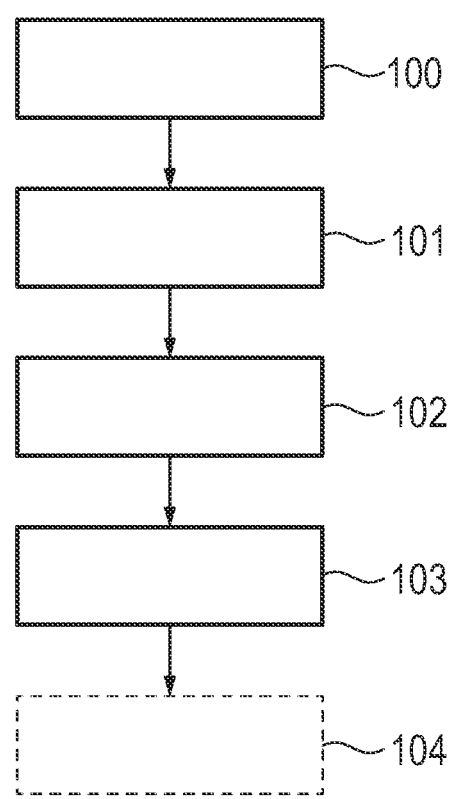
FIG. 3 shows a schematic flowchart of an example of the method.

FIG. 3 shows a schematic flowchart of an example of the method for providing a component assembly for power electronics.

In a step 100, a power module and a connection module are arranged in a housing, such as a pulse inverter. For example, the power module and the connection module are arranged next to each other on a heat sink of the housing, for example on different tiers of the heat sink (see FIG. 1). For this purpose, the modules are mechanically connected to the housing, for example by means of suitable cylindrical threaded screws and/or spacers made of iron and/or plastic and/or by other fixation to the heat sink. Fixing can also be done, for example, by means of a suitable adhesive.

In a step 101, the arranged power module and the arranged connection module are electrically connected to each other via first signal lines. For this purpose, for example, bond connections and/or connections made of conductive sheets can be formed.

In a step 102, a control circuit carrier separate from the power module and the connection module is arranged in the housing. For this purpose, the control circuit carrier is mechanically connected to the housing, for example by means of suitable cylindrical threaded screws and/or spacers made of iron and/or plastic. In particular, the control circuit carrier is arranged in the housing in such a way that the power module is at least partially arranged between the control circuit carrier and the housing, as shown in FIGS. 1 and 2 by way of example.

In a step 103, the connection module is electrically connected to the control circuit carrier by means of second electrical signal lines. For this purpose, for example, bond connections and/or connections made of conductive sheets can be formed.

A step 104 may provide that at least a number of connection areas where the electrical signal lines are connected to the modules and/or the control circuit carrier are at least partially surrounded by a molding compound. For this purpose, the connection areas are overmolded with the molding compound, for example with an epoxy resin.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A component assembly for power electronics, the component assembly comprising:

at least one power module;
at least one separate connection module;
a separate control circuit carrier; and
a housing,
    wherein the at least one power module, the at least one connection module, and the separate control circuit carrier are arranged in a specified manner in the housing,
    wherein the at least one power module is connected via first electrical signal lines to the at least one connection module,
    wherein the at least one connection module is connected to the control circuit carrier via second electrical signal lines, and
    wherein the at least one connection module has a predetermined electrical line layout that electrically connects connection areas of the first electrical signal lines in a predetermined manner with connection areas of the second electrical signal lines.

2. The component assembly according to claim 1, wherein at least a number of the connection areas at which the first and second electrical signal lines are each connected to the at least one power module, the at least one connection module and/or the control circuit carrier are at least partially surrounded by a molding compound, respectively.

3. The component assembly according to claim 1, wherein the at least one power module, the at least one connection module and the control circuit carrier are each arranged in a different plane.

4. The component assembly according to claim 1, wherein the at least one power module, the at least one connection module and the control circuit carrier are mechanically connected to the housing.

5. The component assembly according to claim 1, wherein the at least one power module is at least partially disposed between the control circuit carrier and the housing, wherein the at least one connection module, with respect to a direction of expansion of a plane of the control circuit carrier, is disposed next to the control circuit carrier.

6. The component assembly according to claim 1, wherein at least a number of the first electrical signal lines and/or the second electrical signal lines are formed as bond connections.

7. The component assembly according to claim 1, wherein at least a number of the first electrical signal lines and/or the second electrical signal lines are formed as electrically conductive sheets.

8. A vehicle comprising at least one of the component assembly according to claim 1.

9. A method for providing a component assembly for power electronics, the method comprising:
    arranging at least one power module, at least one separate connection module, and a separate control circuit carrier in a predetermined manner and sequence in a housing; and
    electrically connecting the at least one power module, the at least one separate connection module, and the separate control circuit carrier,
    wherein the at least one power module is connected to the at least one connection module via a first electrical signal line and the at least one connection module is connected to the control circuit carrier via a second electrical signal line, and
    wherein the at least one connection module has a predetermined electrical line layout that electrically connects connection areas of the first electrical signal lines in a predetermined manner with connection areas of the second electrical signal lines.

* * * * *